United States Patent
Backhaus

(10) Patent No.: US 6,485,682 B1
(45) Date of Patent: Nov. 26, 2002

(54) HARDENED ALUMINUM ALLOY FOR USE IN THE MANUFACTURE OF PRINTED CIRCUIT BOARDS

(76) Inventor: Dieter Backhaus, 79350 Sexau, Am Paradies 16 (DE)

( * ) Notice: Subject to any disclaimer, the term of this patent is extended or adjusted under 35 U.S.C. 154(b) by 0 days.

(21) Appl. No.: 09/707,255

(22) Filed: Nov. 6, 2000

(51) Int. Cl.$^7$ ................................. C22C 21/06
(52) U.S. Cl. ................ 420/542; 420/543; 420/546; 420/553
(58) Field of Search ................. 420/543, 544, 420/546, 553, 542

(56) References Cited

U.S. PATENT DOCUMENTS 3,502,448 A * 3/1970 Anderson et al. .......... 29/183.5

* cited by examiner

Primary Examiner—George Wyszomierski
Assistant Examiner—Janelle Combs Morillo
(74) Attorney, Agent, or Firm—William B. Ritchie

(57) ABSTRACT

A hardened aluminum alloy, for use in the manufacture of printed circuit boards, having elevated levels of manganese and magnesium and produced as a sheet by a cold rolling process to a specified thickness.

2 Claims, 1 Drawing Sheet

HARDENED ALUMINUM ALLOY FOR USE IN THE MANUFACTURE OF PRINTED CIRCUIT BOARDS

FIELD OF THE INVENTION

This invention relates to the field of circuit boards and, in particular, to aluminum alloys for use in the manufacture of printed circuit boards.

BACKGROUND OF THE INVENTION

It is well known in the art that an elementary printed circuit board includes conductive foil sheets laminated on opposite sides of a prepreg (a glass fabric reinforced with epoxy resin). Subsequently, the copper is etched to produce conductive paths on the surface of the prepreg layer. It is not uncommon to assemble a stack, called a book, of such boards in the manufacturing process. Separator sheets are used to keep the boards in the book from touching.

To function properly, it is important to have a copper foil free from defects such as dents, scratches, and bumps. If defects appear in the copper foil, proper conductive paths cannot be etched in the image transfer process, leading to open circuits or electrical shorts in the finished product. Therefore, the copper foil surface must be even. Such an even surface can only be achieved by using separator sheets with a completely smooth surface.

Separator sheets are often made of stainless steel. However, this approach includes a major drawback. Stainless steel is a poor conductor of heat, meaning it takes more time and thus requires more energy to heat the books.

As a consequence, aluminum sheets are used more and more frequently, since aluminum conducts the heat better and more evenly than steel. For example, U.S. Pat. No. 5,256,474 issued to Johnston disclose a separator-release plate for use in the lamination and drilling of printed circuit boards comprising a substrate sheet of aluminum foil, rather than a stainless steel plate. Similarly, U.S. Pat. No. 5,725,937 issued to Johnston discloses a laminate of copper and aluminum foil for use in the manufacture of printed circuit birds.

Other benefits of using aluminum foil include a lower cost than stainless steel plates.

Problems still exist with the CAC approach. The aluminum is softer than stainless steel, causing a "gravestone rubbing" effect. In turn this affects the image transfer process and can lead to dysfunctional circuitry in the final product.

Therefore, what is needed is a separator sheet that is less expensive that stainless steel and can help smooth out any small flaws in the copper foil surface. Also, an aluminum alloy that is not too soft to be effective is needed.

SUMMARY OF THE INVENTION

The present invention presents a hardened aluminum alloy for use in the manufacture of printed circuit boards. While this alloy is used in the aircraft construction industry, it is not used in the manufacture of printed circuit boards as a separator sheet. As a separator sheet, the hardened alloy allows less image transfer and smoother copper foil surfaces in the circuit board.

The alloy is hardened relative to standard material used in the art due to elevated levels of magnesium and manganese in the alloy. The alloy is made into separator sheets, or a foil, by a cold rolling process. The optimal thickness of such foil is well known in the art.

Therefore, it is an aspect of this invention to provide a hardened. aluminum alloy for use in the manufacture of printed circuit boards.

It is another aspect of this invention to provide a separator sheet that is less expensive than stainless steel sheets and which due to it's reduced thickness allows more boards to fit each to each press load.

It is another aspect of this invention to provide a separator sheet that can be recycled.

It is a further aspect of this invention to provide a separator sheet that helps smooth out small wrinkles in the surface of the copper foil.

It is a further aspect of this invention to provide a separator sheet that does not react chemically with copper.

DETAILED DESCRIPTION OF THE INVENTION

Figure 1:
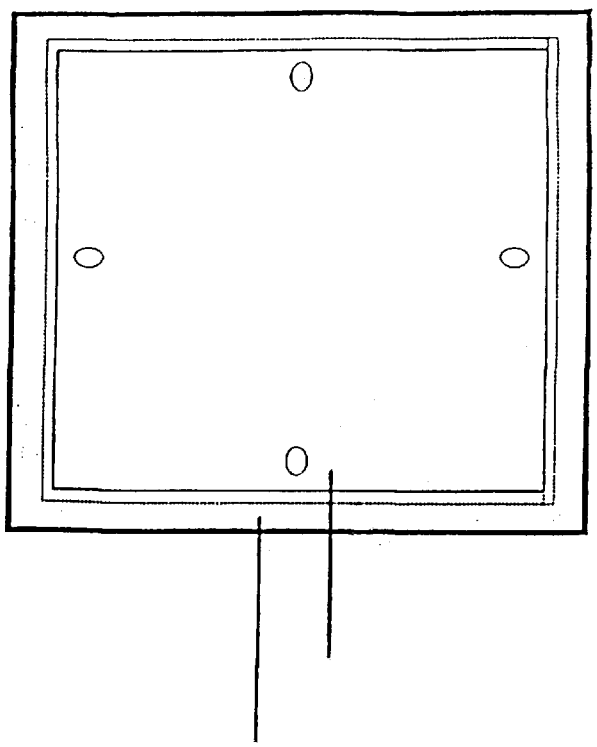
FIG. 1 is a top view of a separator sheet with a copper foil.
Figure 2:
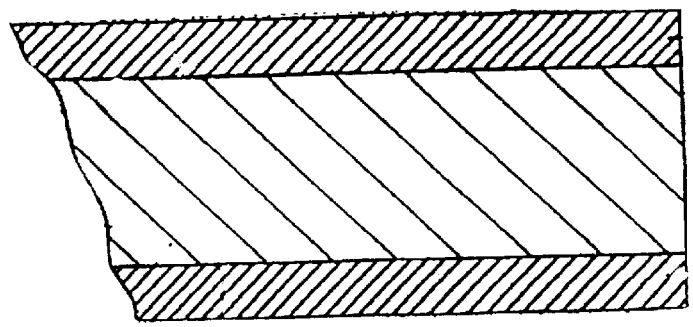
FIG. 2 is a cross section of a CAC configuration.

FIG. 1 and FIG. 2 are included as illustrations of how the present invention, an aluminum separator sheet made from a hardened aluminum alloy, are used in the manufacture of printed circuit boards. FIG. 1 is a top view of separator sheet 2, which is an aluminum sheet made from the hardened alloy of the present invention. Copper foil 4 lies under separator sheet 2 in this drawing, being effectively separated from any additional copper foil (not shown) placed over separator sheet 2.

FIG. 2 is a cross sectional view of separator sheet 2 being used in the manufacture of printed circuit boards. Copper foil 4 is separated from copper foil 6 by separator sheet 2. This is referred to as a CAC configuration. Both foils 4 and 6 form an outer layer of a printed circuit board, and are laminated to a prepreg (not shown). Surface 8 of the copper foil is etched at a later point to form conductive paths on the p-prepreg. Separator sheet 2, in contact with surface 8, can help smooth any small defects in the surface, which may lead to electrical shorts or open circuits in the finished circuit board.

The hardened alloy used to make the-separator sheets of the present invention typically has a tensile strength of over 415 Megapascals (MPa). Samples have been found to have tensile strengths of 419 to 441 Mpa. The following chart compares two sample sheets made from the hardened alloy. Both are embodiments of the present invention. Percentages are shown by weight.

TABLE 1

| Sample # | Si % | Fe % | Cu % | Mn % | Mg % | Cr % | Zn % | Ti % | Tensile Strength |
| --- | --- | --- | --- | --- | --- | --- | --- | --- | --- |
| 1 | .129 | .26 | .041 | .36 | 4.52 | .001 | .006 | .024 | 441 MPa |
| 2 | .127 | .271 | .038 | .35 | 4.55 | .0004 | .0036 | .0235 | 419 MPa |

Table 1 shows the levels of Mn in the alloy to be between 0.3 and 0.4%, while levels of Mg are between 4.5 and 4.6%. By comparison, the chart below shows the composition of a separator sheet made from a standard aluminum alloy commonly used as a separator in the manufacture of printed circuit boards.

TABLE 2

| Si % | Fe % | Cu % | Mn % | Mg % | Cr % | Zn % | Ti % | Tensile Strength |
|------|------|------|------|------|------|------|------|------------------|
| 21   | .23  | .019 | .035 | 2.49 | .19  | .007 | .02  | 327 MPa          |

By comparing Table 1 with Table 2, it can be seen that the alloy used in the present invention contains elevated levels of Mn and Mg. This, in combination with the cold rolling process, yields a hardened aluminum separator sheet with a higher tensile strength.

In reference to FIG. 2, separator sheet 2 made from the hardened alloy can help smooth out any small defects in surface 8 when books of circuit boards are pressed and also significantly reduces the risk of image transfer. This allows for a smoother surface which provides for successful imaging of conductive paths to be etched in the surface of the copper foil. A soft aluminum alloy would produce a "gravestone rubbing" effect, conforming itself to the defects in the copper foil and the image of the circuitry underlying the copper foil and creating a surface with a rougher topography.

Similar to other aluminum separator sheets, sheets from the present invention can be recycled after use.

Although the present invention has been described with reference to certain preferred embodiments thereof, other versions are readily apparent to those of ordinary skill in the art. Therefore, the spirit and scope of the appended claims should not be limited to the description of the preferred embodiments contained herein.

What is claimed is:

1. An aluminum alloy for use in manufacturing printed circuit boards comprising: between 0.3% and 0.4% manganese, and between 4.5% and 4.6% magnesium wherein said levels of manganese and magnesium substantially harden said alloy to a tensil strength of at least 415 MPa.

2. The alloy as claimed in claim 1, wherein said alloy is made into a sheet of a first thickness by a cold rolling process.

* * * * *